(12) United States Patent
Kano et al.

(10) Patent No.: US 6,595,050 B2
(45) Date of Patent: Jul. 22, 2003

(54) WIRE BONDED SENSOR AND METHOD FOR MANUFACTURING WIRE BONDED SENSOR

(75) Inventors: Kazuhiko Kano, Toyoake (JP); Yukihiro Takeuchi, Nishikamo-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/196,275

(22) Filed: Jul. 17, 2002

(65) Prior Publication Data
US 2003/0015033 A1 Jan. 23, 2003

(30) Foreign Application Priority Data
Jul. 18, 2001 (JP) ........................................ 2001-218216

(51) Int. Cl.$^7$ ................................................ G01F 1/68
(52) U.S. Cl. ................................................ 73/204.26
(58) Field of Search ........................ 73/204.26, 204.27, 73/726, 706, 721, 727, 756; 257/467, 252; 216/20, 18, 17; 250/338.3, 340; 200/512, 513

(56) References Cited

U.S. PATENT DOCUMENTS

| | | | |
|---|---|---|---|
| 4,024,560 A | * 5/1977 | Miller et al. | 257/252 |
| 5,205,170 A | * 4/1993 | Blechinger et al. | 73/204.26 |
| 5,423,212 A | * 6/1995 | Manaka | 73/204.26 |
| 5,522,267 A | * 6/1996 | Lewis | 73/726 |
| 5,703,287 A | * 12/1997 | Treutler et al. | 73/204.26 |
| 5,965,811 A | * 10/1999 | Kawai et al. | 73/204.26 |
| 6,047,604 A | * 4/2000 | Auburger et al. | 73/756 |
| 6,194,678 B1 | * 2/2001 | Yoshikawa et al. | 200/512 |
| 6,357,294 B1 | * 3/2002 | Nakada | 73/204.26 |
| 6,425,287 B1 | * 7/2002 | Tominaga et al. | 73/204.26 |
| 6,450,025 B1 | * 9/2002 | Wado et al. | 73/204.26 |

* cited by examiner

Primary Examiner—Hezron Williams
Assistant Examiner—Jewel V. Thompson
(74) Attorney, Agent, or Firm—Nixon & Vanderhye P.C.

(57) ABSTRACT

A sensor includes a first insulating layer, a second insulating layer having an opening, a plurality of metal wirings, and a plurality of electrodes. Each metal wiring has a contacting area. Each metal wiring is located between the first and second insulating layers. Each electrode has a bonding region located separately from the contacting area. The electrodes are in electrical connect with the contacting areas through the openings. A part of each metal wiring is located beneath each bonding region. The electrodes include any of aluminum, two metals of gold and titan, or three metals of gold, nickel, and titan. When the electrodes include aluminum, the electrodes are annealed such that the surface roughness of the electrode is smaller than 100 angstroms. When the electrodes include the two or three metals, the electrodes are annealed in an atmosphere that a partial pressure of oxygen is lower than $10^{-1}$ Pa.

3 Claims, 10 Drawing Sheets

FIG. 4
| ANNEALING CONDITIONS | 400°C 30min | 400°C 10min | 350°C 30min | 350°C 10min |
|---|---|---|---|---|
| SURFACE ROUGHNESS Ra (Å) | 1048.931 | 1162.34 | 1051.891 | 1828.17 |
| PITS IN ELECTRODE (×10K) |  |  | 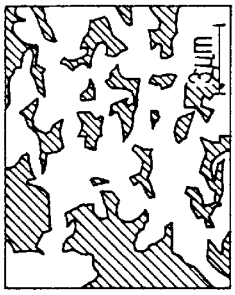 | 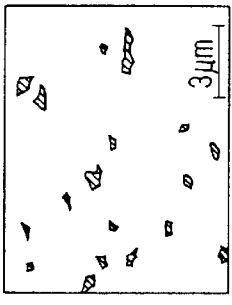 |
| ANNEALING CONDITIONS | 300°C 30min | 300°C 10min | 250°C 30min | 250°C 10min |
| SURFACE ROUGHNESS Ra (Å) | 27.051 | 22.821 | 16.642 | 14.18 |
| PITS IN ELECTRODE (×10K) | 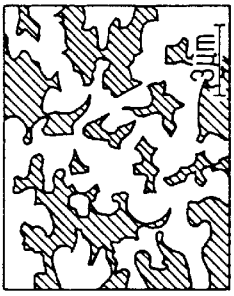 | 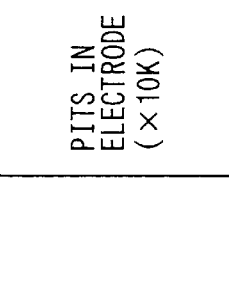 | 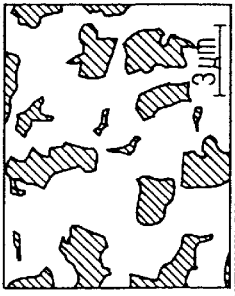 | 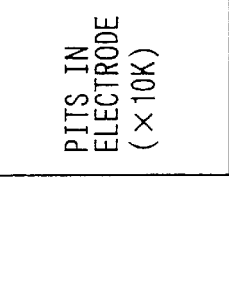 |

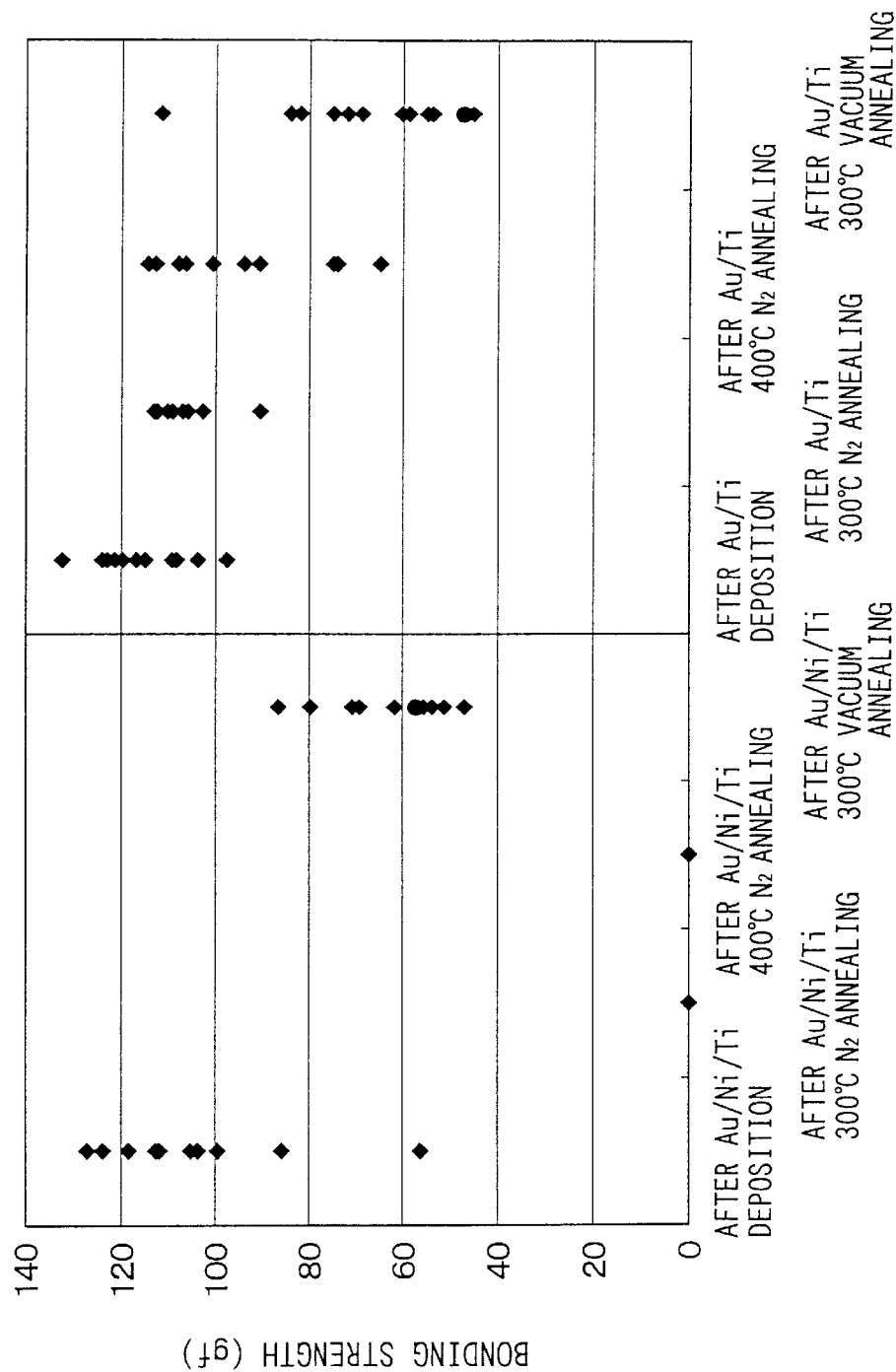

WIRE BONDED SENSOR AND METHOD FOR MANUFACTURING WIRE BONDED SENSOR

CROSS REFERENCE TO RELATED APPLICATION

This application is based on and incorporates herein by reference Japanese Patent Application No. 2001-218216 filed on Jul. 18, 2001.

BACKGROUND OF THE INVENTION

The present invention relates to a sensor, in which a metal electrode having a bonding region is in connect with a metal layer located between a first insulating layer and a second insulating layer through an opening located in the second layer, and a method for manufacturing the sensor.

A sensor, in which a metal layer is located on a diaphragm and a physical quantity is measured on a basis of a variation in a physical characteristic of the metal layer, is proposed. For example, in a proposed flow sensor, a heater and a thermometer are formed using the metal layer made of platinum on the membrane, and the flow rate of a fluid, which flows on the surface of the membrane, is measured by measuring the heat that is transmitted from the thermometer to the fluid or transmitted from the fluid to the thermometer.

Sensors of this type are described by U.S. Pat. No. 5,703,287. In a sensor shown in FIG. 11A, a patterned platinum layer 101 is located between a membrane layer 100 and a passivation layer 102. A metal electrode 103 having a bonding region 105 is in contact with the platinum layer 101 through an opening in the passivation layer 102. In the sensor shown in FIG. 11A, the bonding region 105, where the bonding wire 104 is connected to the metal electrode 103, is located above the opening of the passivation layer 102.

However, in the sensor shown in FIG. 11A, the platinum layer 101 tends to peel due to the stress during a wire bonding operation because the adhesion between the platinum layer 101 and the membrane layer 100 is relatively weak. Therefore, the structure of the bonding region 105 in another sensor shown in FIG. 11B, in which the bonding region 105 is separated from the opening by using the extended metal electrode 103, is preferred in this aspect.

However, the structure of the bonding region 105 in another sensor shown in FIG. 11B has the following problem. In the sensor shown in FIG. 11A, the bonding region 105 is composed of the platinum layer 101 and the metal electrode 103. That is, the thickness of the bonding region 105 is the sum of the thicknesses of the platinum layer 101 and the metal electrode 103. On the other hand, in the sensor shown in FIG. 11B, the bonding region 105 is composed of the metal electrode 103. Therefore, the metal electrode 103 needs to be relatively thicken, for example, approximately one micrometer, to be elastically deformed sufficiently during the wire bonding.

In the case that the metal electrode 103 is substantially made of aluminum, which is commonly used in the semiconductor manufacturing process, aluminum atoms of the metal electrode 103 diffuse into the platinum layer 101 and countless pits, which reach the platinum layer 101, are formed in the metal electrode 103 when the metal electrode 103 and the platinum layer 101 are annealed at about 400° C. for the purpose of reducing contact resistance. As a result, wire bonding quality becomes relatively poor in the sensor shown in FIG. 11A, and the electric connection between the platinum layer 101 and the bonding wire 104 becomes relatively poor in the sensor shown in FIG. 11B because the metal electrode 103 tends to break at the edge, which is located at the upper end of the wall that defines the opening, of the passivation layer 102.

SUMMARY OF THE INVENTION

The present invention has been made in view of the above aspects with an object to provide a sensor having a desired quality in wire bonding at a bonding region of a metal electrode, which is in contact with a metal layer located between a first insulating layer and a second insulating layer through an opening in the second layer, and to provide a method for manufacturing the sensor.

In the present invention, a sensor includes a first insulating layer, a second insulating layer having an opening, a plurality of metal wirings, and a plurality of electrodes. Each metal wiring has a contacting area, which is located at the bottom of each opening. Each metal wiring is located between the first and second insulating layers except the contacting area. Each electrode has a bonding region located separately from the contacting area. The electrodes are in electrical connect with the contacting areas through the openings. A part of each metal wiring is located beneath each bonding region to provide substantially the same effect as in increasing the thickness of the bonding regions. Therefore, the otherwise thicker bonding region, that is, the otherwise thicker electrode, can be thinned.

The electrodes include any of aluminum, two metals of gold and titan, or three metals of gold, nickel, and titan. When the electrodes include aluminum, the electrodes are annealed such that the surface roughness of the electrode is smaller than 100 angstroms. When the electrodes include two metals of gold and titan or three metals of gold, nickel, and titan, the electrodes are annealed in an atmosphere that a partial pressure of oxygen is lower than $10^{-1}$ Pa.

BRIEF DESCRIPTION OF THE DRAWINGS

The above and other objects, features and advantages of the present invention will become more apparent from the following detailed description made with reference to the accompanying drawings. In the drawings:

FIG. 4 is a table showing the correlation between the surface roughness and the annealing conditions and the correlation between the pits and the annealing conditions of the aluminum electrode according to the second embodiment;

FIG. 10 is a graph showing the correlation between bonding strength and annealing conditions of the electrode according to the third embodiment.

DETAILED DESCRIPTION OF THE PREFERRED EMBODIMENTS

The present invention will be described in detail with reference to various embodiments.

First Embodiment

Figure 1:
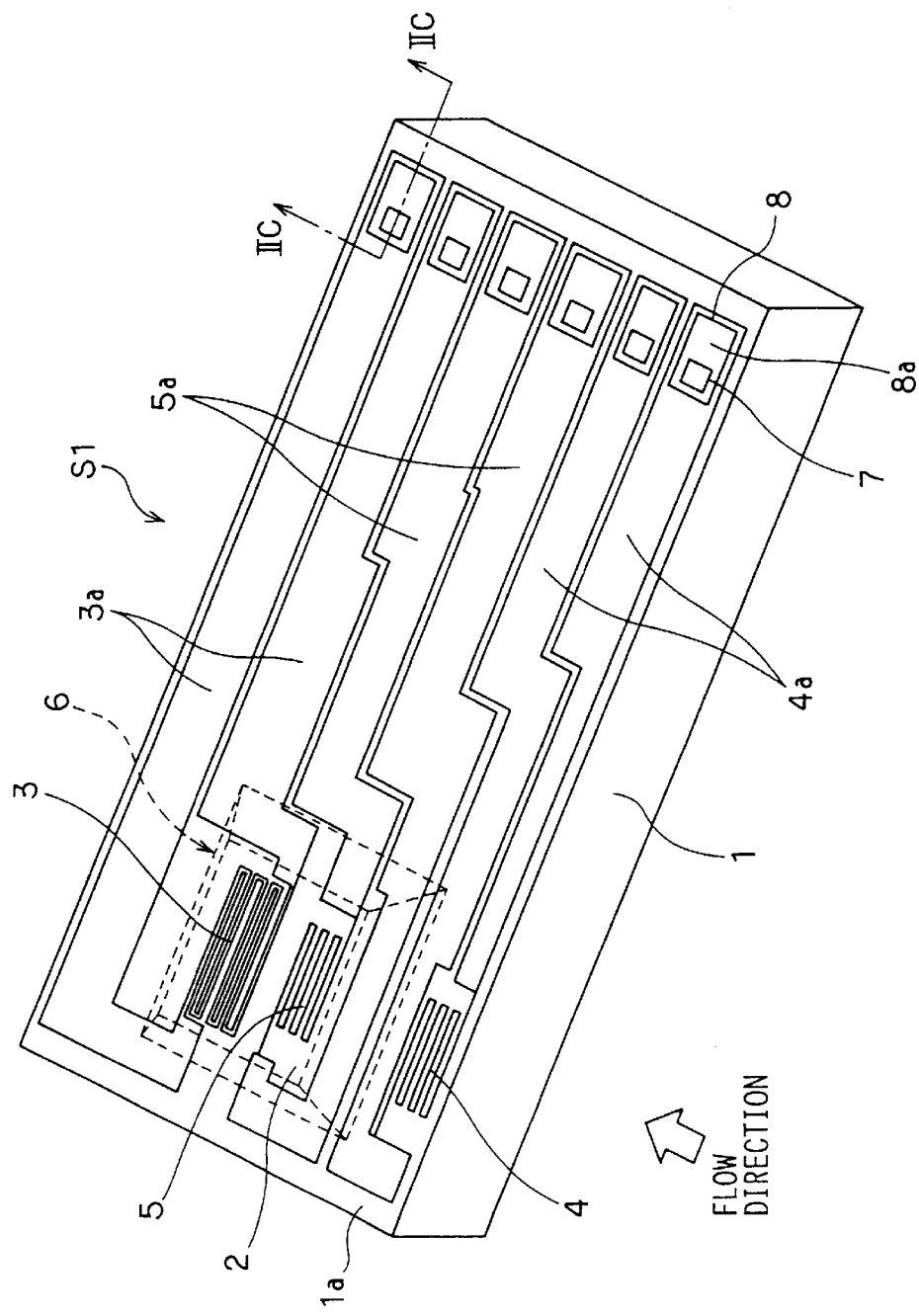
FIG. 1 is a perspective view of a flow sensor S1 according to the first embodiment of the present invention.

As shown in FIG. 1, the flow sensor S1 includes a semiconductor substrate 1, which is made of single crystal silicon. The substrate 1 has an active surface 1a and a back surface. The two surface face in the opposite direction. A recess 6 is located in the back surface to form a diaphragm 2, which is a thin membrane. On the active-surface-side surface of the diaphragm 2, a heater 3, which is a winding metal line, is located. In FIG. 1, a flow direction of a fluid is denoted by an arrow. In the upstream side of the heater 3 in the flow direction, a flow rate thermometer 5, which is another winding metal line, is located on the active surface 1a. In the upstream side of the flow rate thermometer 5, a reference thermometer 4, which is other winding metal line for measuring the initial temperature of the fluid, is located on the active surface 1a. In the flow sensor in FIG. 1, the heater 3, the reference thermometer 4, and the flow rate thermometer 5 respectively include two stacked metal layers, specifically, a platinum layer and a titan layer. The two stacked metal layers of the heater 3, the reference thermometer 4, and the flow rate thermometer 5 are patterned out of the same stacked platinum and titan films, as described later.

As shown in FIG. 1, each of the heater 3, the reference thermometer 4, and the flow rate thermometer 5 is in connect with a pair of metal wirings 3a, 4a, 5a, which are patterned out of the same stacked films as for the heater 3 and the thermometer 4, 5 and extend to an end of the substrate 1. At the end of the substrate 1, each metal wiring 3a, 4a, 5a has a contacting area 7, where each metal wiring 3a, 4a, 5a is in contact with an electrode 8. Each electrode 8 is a metal layer made of gold or platinum. In the flow sensor S1 in FIG. 1, each electrode 8 extends outward from the contacting area 7 to form a bonding region 8a separately from the contacting area 7.

When the flow rate of the fluid is measured, the heater 3 is operated such that the temperature of the heater 3 becomes higher than the initial temperature of the fluid, which is measured by the reference thermometer 4, by a predetermined increment. If the fluid flows in the direction denoted by the arrow in FIG. 1, the temperature of the flow rate thermometer 5 falls because the heat in the flow rate thermometer 5 is transmitted to the fluid. On the other hand, if the fluid flows in the direction opposite from the direction denoted by the arrow in FIG. 1, the temperature of the flow rate thermometer 5 rises because the flow rate thermometer 5 is heated by the fluid heated by the heater 3. Therefore, the flow rate and the flow direction of the fluid are measured on the basis of the difference in temperature between the flow rate thermometer 5 and the reference thermometer 4. The temperatures of the thermometers 4, 5 are measured on the basis of the variation in resistance of the metal lines 4, 5, which make up the thermometers 4, 5.

Figure 2A:
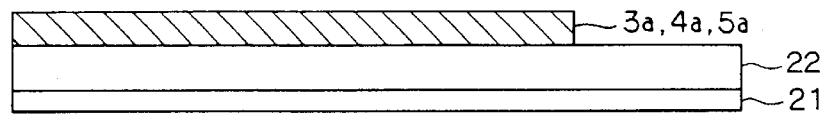
FIGS. 2A to 2C are step-by-step schematic partial cross-sectional views showing the production process of the bonding region according to the first embodiment of the present invention.

The flow sensor S1 in FIG. 1 is manufactured as follows. A first silicon nitride film 21 is formed on the active surface 1a of the semiconductor substrate 1 by PE-CVD or LP-CVD. Then, a first silicon oxide film 22 is formed on the first silicon nitride film 21 by PE-CVD. The first films 21, 22 make up a first insulating layer 21, 22. Subsequently, a titan film and a platinum film are deposited in this order on the first silicon oxide film 22 by vapor or sputter deposition. The heater 3, the thermometers 4, 5, and the metal wirings 3a, 4a, 5a are simultaneously patterned out of the same titan and platinum films by photolithography and etching using ion milling, as shown in FIG. 2A, in which the substrate 1 underling the deposited films 21, 22 is not illustrated. The metal wirings 3a, 4a, 5a are formed to be located beneath the bonding regions 8a, which are formed at a later step.

Figure 2B:
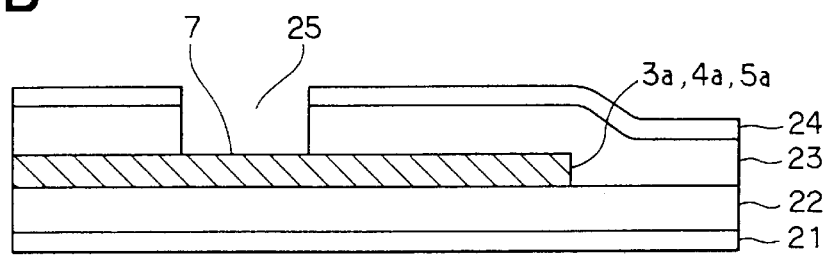
Figure 2C:
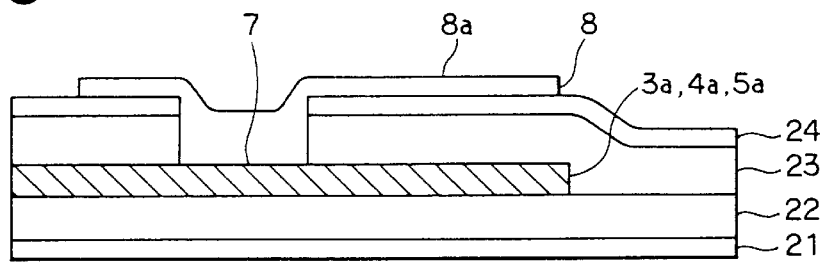

A second silicon oxide film 23 is deposited on the heater 3, the thermometers 4, 5, the metal wirings 3a, 4a, 5a, and the first silicon oxide film 22 by PE-CVD. Then, a second silicon nitride film 24 is deposited on the second silicon oxide film 23 by PE-CVD or LP-CVD. The second films 23, 24 make up a second insulating layer 23, 24. Subsequently, an opening 25 is formed in the second films 23, 24 to permit each metal wiring 3a, 4a, 5a to contact each electrode 8, which is formed at a later step, at the contacting area 7, as shown in FIG. 2B. Each opening 25 is bottomed the contacting area 7. Then, as shown in FIG. 2C, which is a cross-sectional view taken along line IIC—IIC in FIG. 1, the electrode 8 having the bonding region 8a, which is separated from the contacting area 7, is patterned out of a metal film, which is deposited to cover the opening 25.

Figure 3:
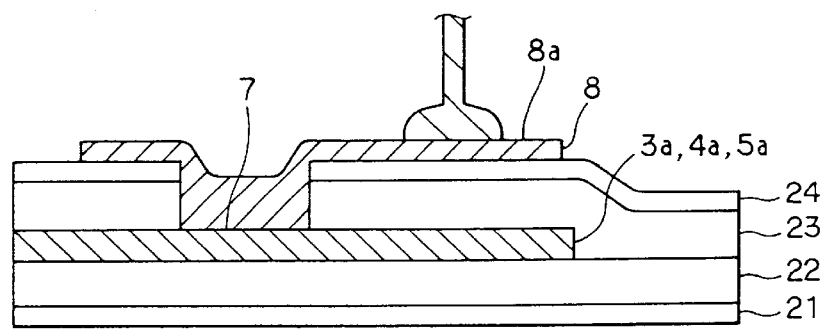
FIG. 3 is a partial cross-sectional view showing a state that a bonding wire is bonded to the bonding region.

As shown in FIG. 3, in the flow sensor S1 in FIG. 1, a part of each metal wiring 3a, 4a, 5a is located beneath each bonding region 8a, and the parts located beneath the bonding regions 8a provide substantially the same effect as in increasing the thickness of the bonding regions 8a. Therefore, the otherwise thicker bonding regions 8a can be thinned. The electrodes 8 are made of a noble metal, gold or platinum, to assure the reliability, so the manufacturing cost is relatively significantly decreased by thinning the electrodes 8. In addition, the electrodes 8 may be made of the same metals (platinum/titan) as for the heater 3, the thermometers 4, 5, and the metal wirings 3a, 4a, 5a to reduce the manufacturing cost by consolidating raw materials.

Second Embodiment

A flow sensor according to a second embodiment has the same structure as the flow sensor S1 in FIG. 1, except that the electrodes 8 are made of aluminum. In the manufacturing process of the flow sensor according to the second embodiment, after the electrodes 8 are patterned out of a deposited aluminum film, the electrodes 8 are annealed in a diffusion furnace with a $N_2$ atmosphere to decrease contact resistance.

As shown by FIG. 4, countless pits, which are hatched areas, exist in the electrodes 8 after the electrode 8 is annealed. The pits are generated since aluminum atoms making up the electrodes 8 diffuse into the platinum layers of the metal wirings 3a, 4a, 5a. Especially at a relatively high temperature over 300° C. such as 350° C. and 400° C., the pits become relatively huge because a plurality of pits are merged, and the mean surface roughness Ra of the electrodes 8, which was measured with the NEW VIEW 200 of ZYGO Inc., becomes larger than 1000 angstroms. The mean surface roughness Ra of the electrodes 8 is preferably smaller than 100 angstroms to assure a desired bonding reliability.

Figure 5:
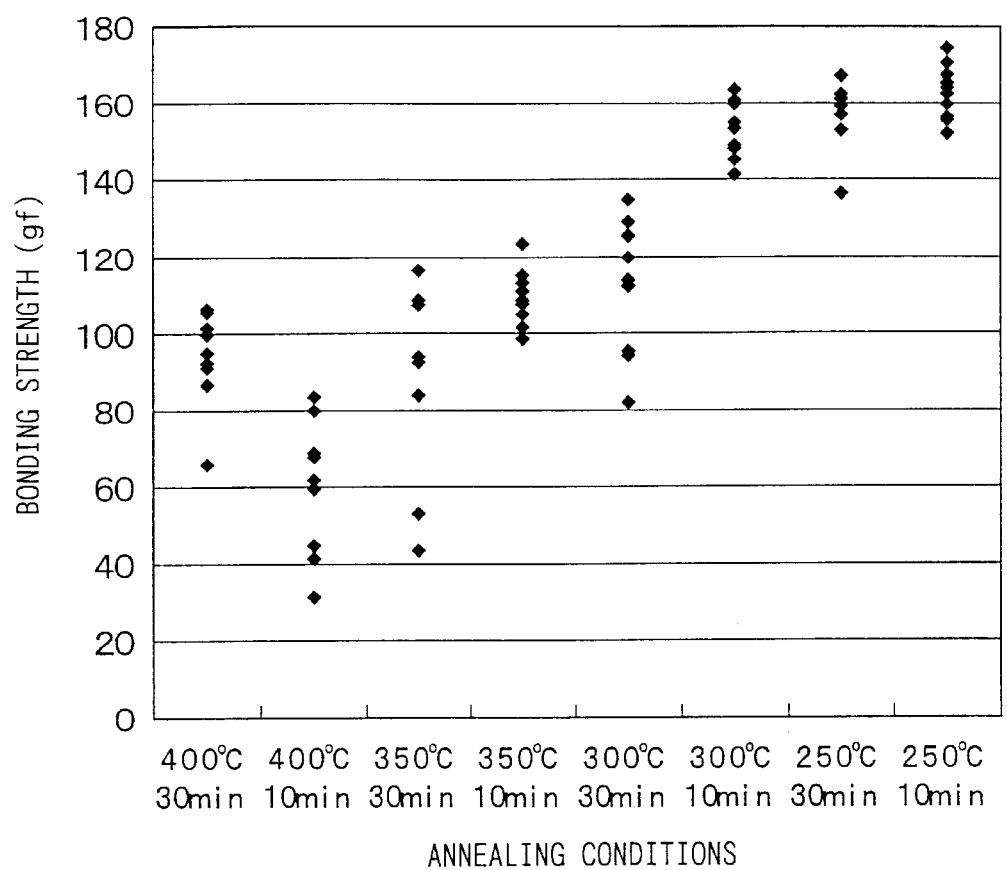
FIG. 5 is a graph showing the correlation between bonding strength and annealing conditions of the aluminum electrode according to the second embodiment.

When the electrodes 8 are annealed at 300° C. or lower, the pits are smaller than those at the relatively high temperature over 300° C. and the number of the pits is less than that at the relatively high temperature over 300° C. Substantially no merged pits are generated, and the mean surface roughness Ra of the electrodes 8 is smaller than 100 angstroms. In addition, as shown in FIG. 5, in which the bonding strength is the ball shear adhesion strength between a gold bonding wire and each aluminum bonding region 8a, the bonding strength is higher on annealing conditions of 300° C. for 10 minutes, 250° C. for 30 minutes, and 250° C. for 10 minutes than on other conditions.

Therefore, in the manufacturing process of the flow sensor according to the second embodiment, the electrodes 8, which are substantially made of aluminum, are annealed at a temperature lower than 300° C. When the electrodes 8 are annealed at a temperature close to 300° C., the annealing period is set to be shorter than 10 minutes.

Third Embodiment

A flow sensor according to a third embodiment has the same structure as the flow sensor S1 in FIG. 1, except that each electrode 8 includes two stacked metal layers, specifically, a gold layer and a titan layer (Au/Ti layers), or includes three stacked metal layers, specifically a gold layer, a nickel layer, and a titan layer (Au/Ni/Ti layers). Each element diffuses less readily into the platinum layers of the metal wirings 3a, 4a, 5a than aluminum, so the electrodes 8 escape the pits, which are generated when aluminum is used. The titan layer of the two stacked metal layers and the nickel and titan layers of the three stacked metal layers are the ones for increasing the adhesion between the electrodes 8 and the second silicon nitride film 24.

In the manufacturing process of the flow sensor according to the third embodiment as well, the titan and gold layers of the two stacked metal layers are deposited in this order, and the titan, nickel, and gold layers of the three stacked metal layers are deposited in this order. After the electrodes 8 are patterned out of the same stacked metal layers, the electrodes 8 are annealed to decrease contact resistance at a temperature higher than 300° C.

Figure 6A:
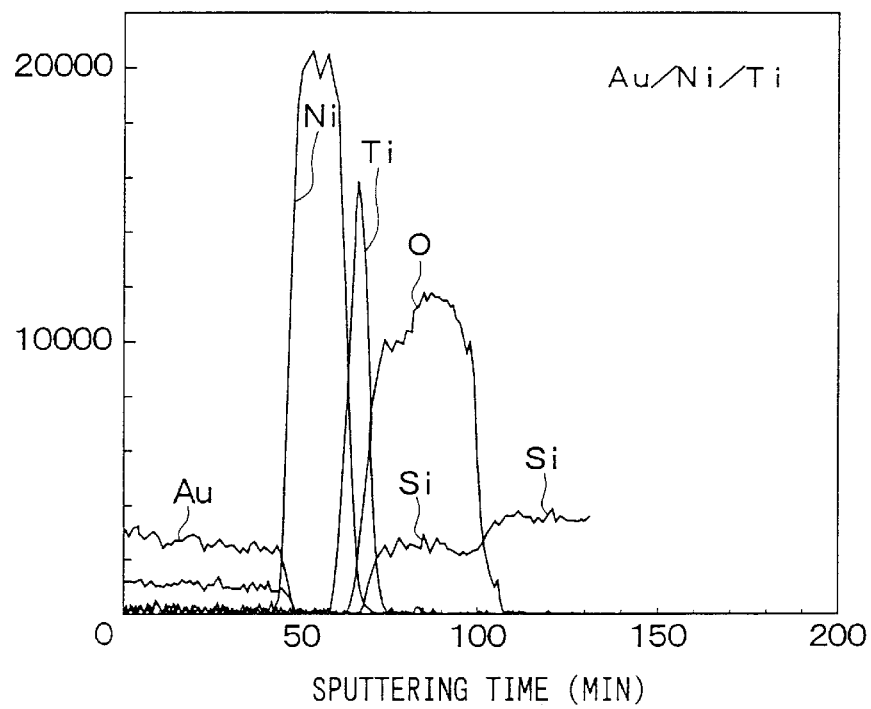
FIGS. 6A and 6B are scanning auger microscopy depth profile of the electrode according to the third embodiment before annealing.
Figure 6B:
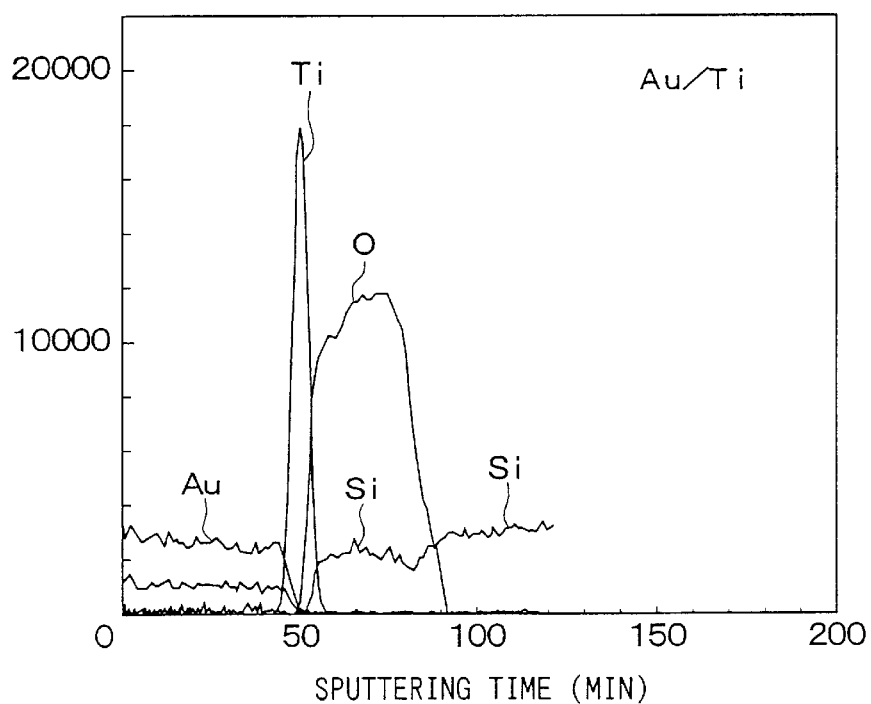
Figure 7A:
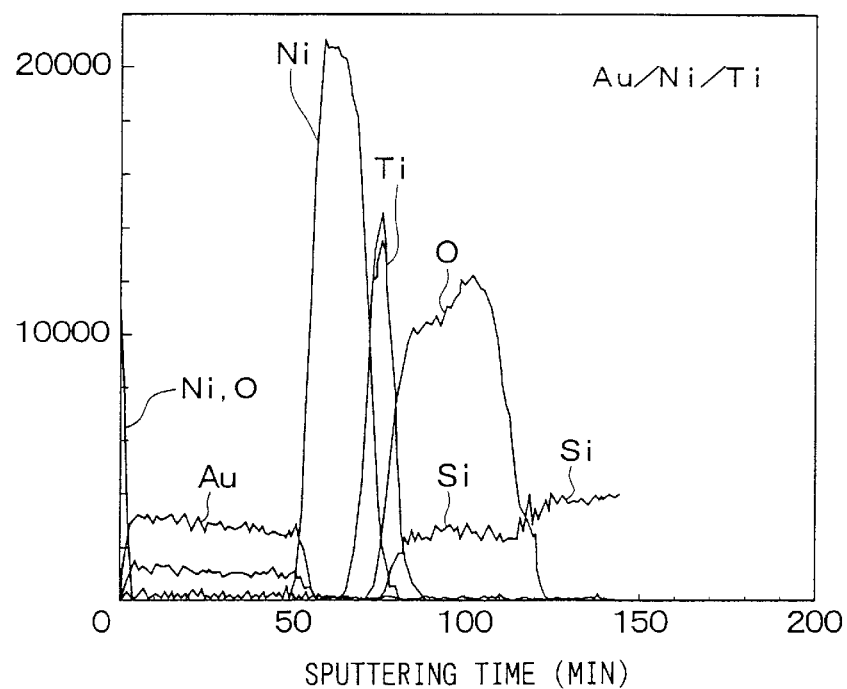
FIGS. 7A and 7B are scanning auger microscopy depth profile of the electrode according to the third embodiment after annealing at 300° C. for 60 minutes with a $N_2$ atmosphere.
Figure 7B:
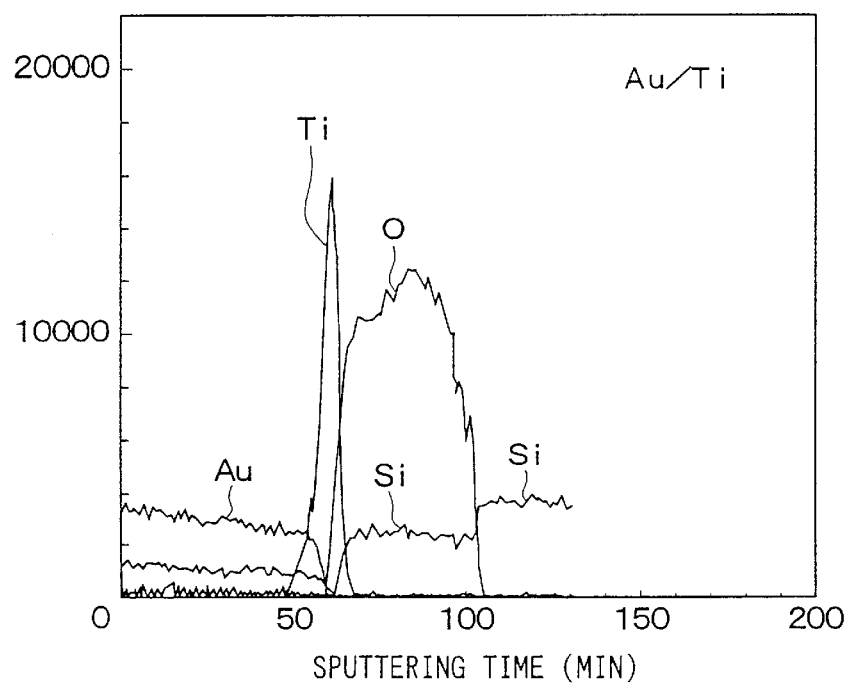
Figure 8A:
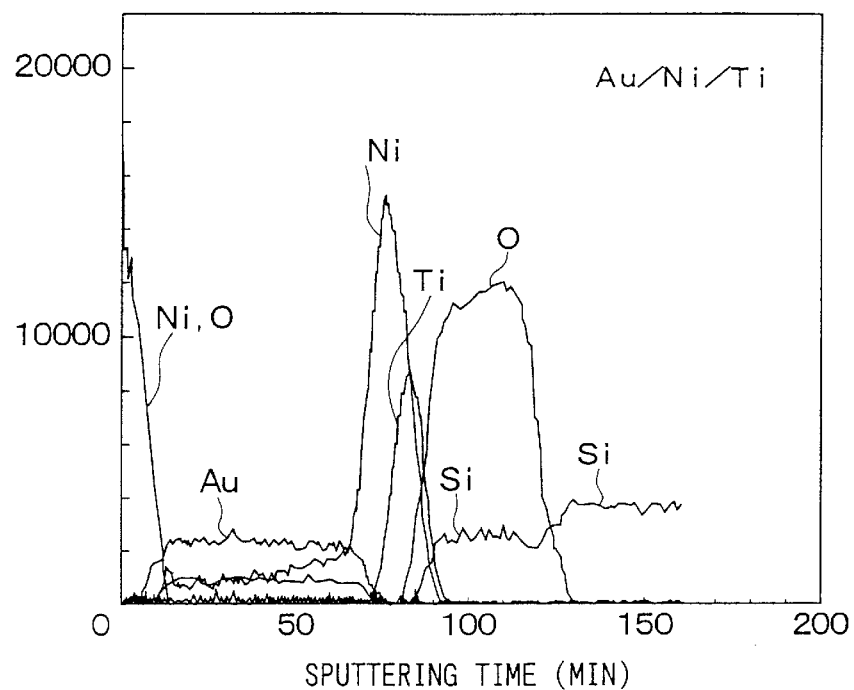
FIGS. 8A and 8B are scanning auger microscopy depth profile of the electrode according to the third embodiment after annealing at 400° C. for 60 minutes with a $N_2$ atmosphere.
Figure 8B:
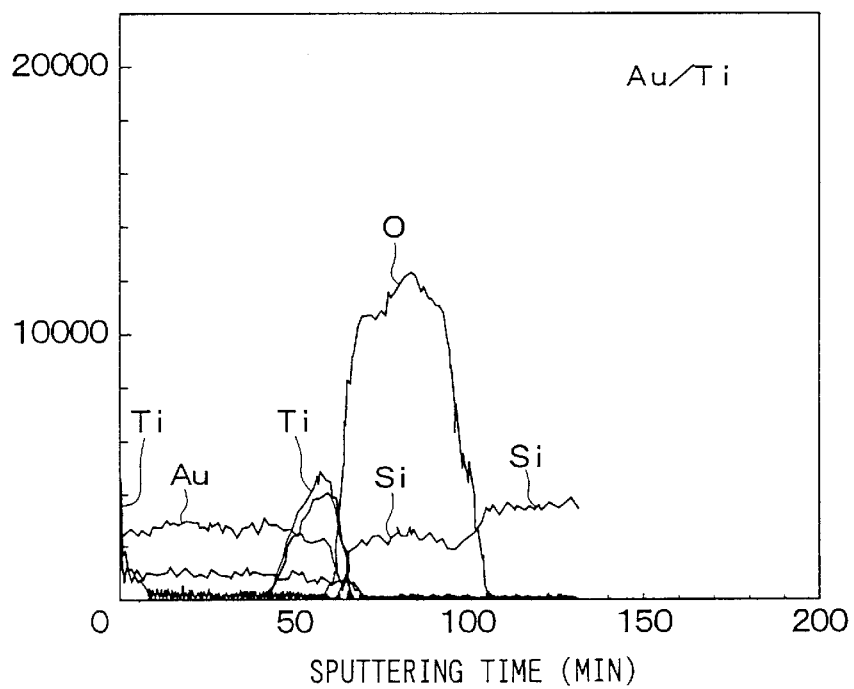

In the manufacturing process of the flow sensor according to the third embodiment, a diffusion furnace and a vacuum furnace are respectively used for annealing the electrodes 8 with a $N_2$ atmosphere and with a vacuum atmosphere. The scanning auger microscopy depth profiles of the electrodes 8 including the three stacked metal layers are shown by FIGS. 6A, 7A, and 8A. The scanning auger microscopy depth profiles of the electrodes 8 including the two stacked metal layers are shown by FIGS. 6B, 7B, and 8B. In each depth profile, the horizontal axis is the sputtering time, which equivalent to the depth from the surfaces of the electrodes 8, and the vertical axis is an intensity of the energies of auger electrons, which is equivalent to the concentration of each element.

As shown by FIGS. 6A and 6B, before annealing, only gold atoms exist at the surfaces of the electrodes 8 including the Au/Ti layers and at that of the Au/Ni/Ti layers. However, as shown in FIG. 7A, after the annealing at 300° C. for 60 minutes with a $N_2$ atmosphere, nickel atoms exist at the surfaces of the electrodes 8 including the Au/Ni/Ti layers. In the case that the annealing temperature is 400° C., more nickel atoms exist at the surface, as shown in FIG. 7B. With respect to the electrodes 8 including the Au/Ti layers, as shown in FIG. 7B, after the annealing at 300° C. for 60 minutes with a $N_2$ atmosphere, no titan atoms exist at the surface of the electrodes 8. However, in the case that the annealing temperature is 400° C., titan atoms exist at the surface, as shown in FIG. 8B.

Figure 9A:
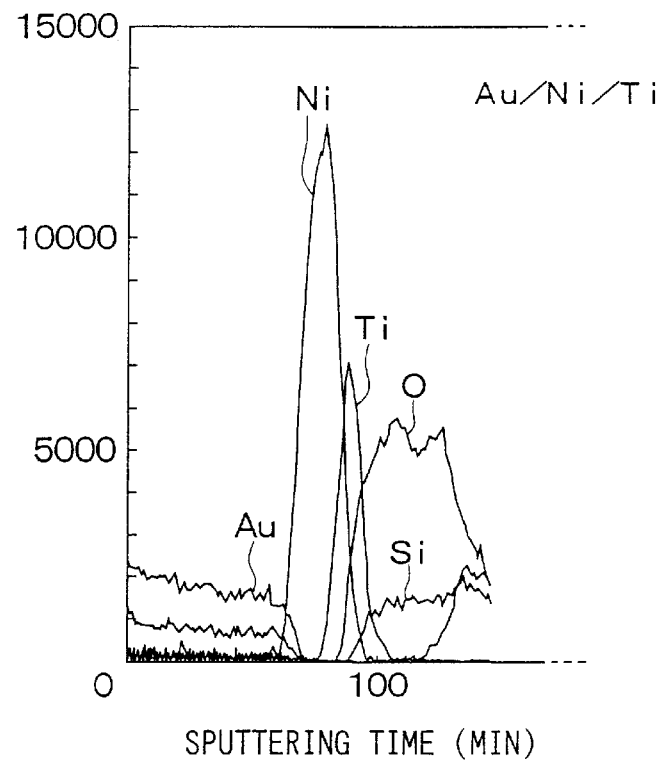
FIGS. 9A and 9B are scanning auger microscopy depth profile of the electrode according to the third embodiment after annealing at 300° C. for 50 minutes with a vacuum atmosphere.
Figure 9B:
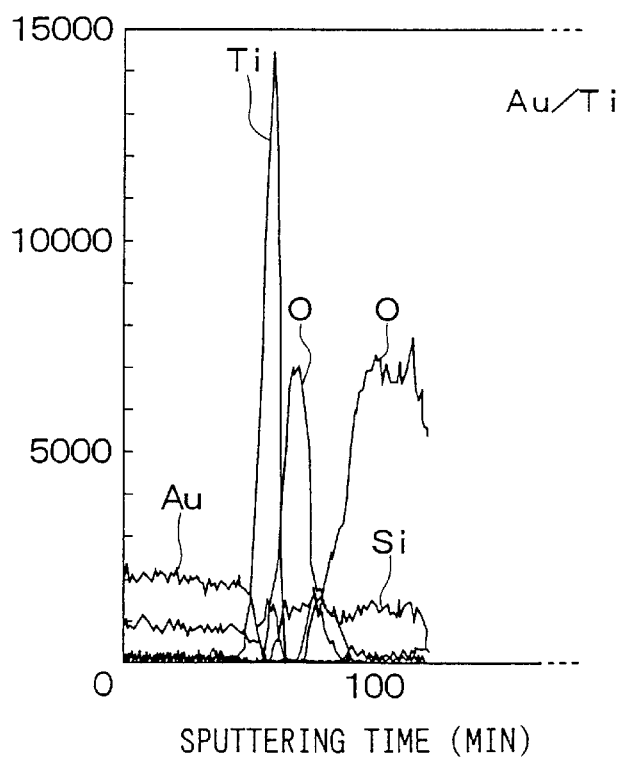
Figure 11A:
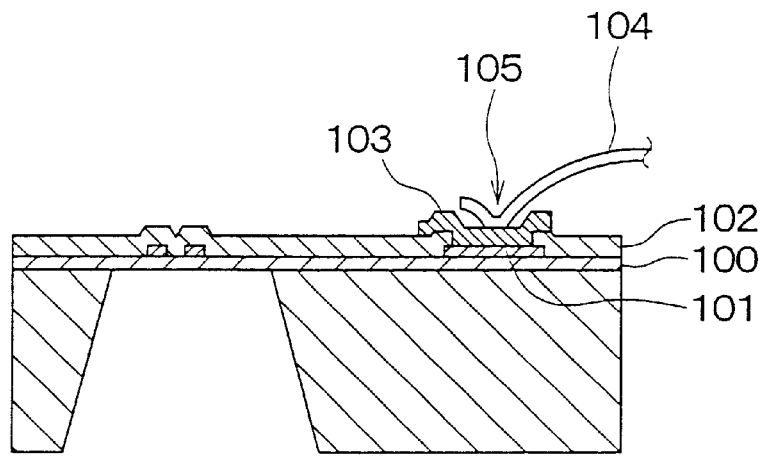
FIGS. 11A and 11B are schematic cross-sectional views of the flow sensors according to a related art.
Figure 11B:
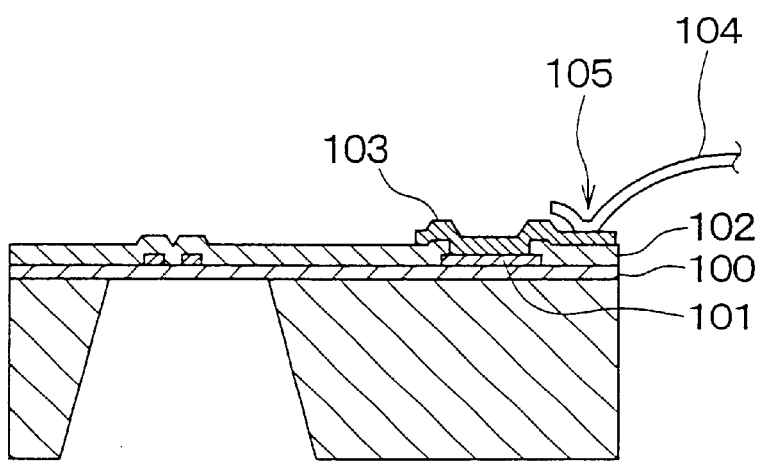

On the other hand, as shown by FIGS. 9A and 9B, in the case that the annealing is conducted at 300° C. for 50 minutes with a vacuum atmosphere, in which the partial pressure of oxygen is lower than $10^{-1}$ Pa, only gold atoms exist at the surface of the electrode 8, neither nickel atoms nor titan atoms exist there. The existence of nickel atoms and titan atoms at the surface is caused by residual oxygen atoms in the diffusion furnace. Nickel atoms and titan atoms are drawn by the residual oxygen atoms and the oxide of them precipitates at the surface. On the other hand, with the vacuum atmosphere, there are not enough oxygen atoms in the vacuum furnace to form the oxide. Therefore, neither nickel atoms nor titan atoms are drawn by the residual oxygen atoms and substantially no oxide of them precipitates at the surface.

As shown in FIG. 10, in which the bonding strength is the ball shear adhesion strength between a gold bonding wire and each bonding region 8a, the bonding strength is substantially zero when the electrodes 8 including the Au/Ni/Ti layers is annealed with the $N_2$ atmosphere. That is to say, if nickel oxide exists on the surface, wire bonding with the gold wire is impossible. On the other hand, when the electrodes 8 including the Au/Ti layers is annealed with the $N_2$ atmosphere, although the bonding strength decreases in comparison with that before the annealing, the bonding strength is high enough. That is to say, even if titan oxide exists on the surface, wire bonding with the gold wire is possible. Even so, the oxide causes a time-dependent deterioration of the bonding strength. Therefore, it is preferred that the electrodes 8 including the Au/Ti layers be annealed with the vacuum atmosphere.

Due to the reasons described above, in the manufacturing process of the flow sensor according to the third embodiment, after the electrodes 8 are patterned out of the stacked metal layers, the electrodes 8 are annealed in the vacuum furnace with the vacuum atmosphere.

Modifications

The present invention may be applied to another type of sensor, which includes a diaphragm and a metal layer for measuring a physical quantity and in which the metal layer is located on the diaphragm, such as an infrared sensor, moisture sensor, and gas sensor. In addition, the present invention may also be applied to other type of sensor that has a thin film structure, in which a recess is located in a substrate and a bridge-like thin film for bridging the recess is located above the recess.

What is claimed is:

1. A sensor comprising:

a first insulating layer;

a second insulating layer having an opening;

a metal wiring having a contacting area, which is located at a bottom of the opening, wherein the metal wiring is located between the first and second insulating layers except the contacting area; and an electrode that is in electrical connect with the contacting area through the opening and has a bonding region separately from the contacting area, wherein a part of the metal wiring is located beneath the bonding region for providing substantially the same effect as in increasing the thickness of the bonding region.

2. The sensor in claim 1, wherein the metal wiring and the electrode include the same metal.

3. The sensor in claim 1, wherein the metal wiring includes a platinum layer and a titan layer.

* * * * *